(12) United States Patent
Groen et al.

(10) Patent No.: US 9,553,566 B2
(45) Date of Patent: *Jan. 24, 2017

(54) HYBRID DRIVER CIRCUIT (71) Applicant: MoSys, Inc., Santa Clara, CA (US)

(72) Inventors: Eric D. Groen, Ankeny, IA (US); Charles W. Boecker, Ames, IA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/564,618

(22) Filed: Dec. 9, 2014

(65) Prior Publication Data

US 2016/0164498 A1    Jun. 9, 2016

(51) Int. Cl.
| H03K 3/012 | (2006.01) |
| H03K 19/00 | (2006.01) |
| H03K 19/003 | (2006.01) |
| H03K 17/687 | (2006.01) |

(52) U.S. Cl.
CPC .......... *H03K 3/012* (2013.01); *H03K 19/0016* (2013.01); *H03K 19/00361* (2013.01); *H03K 19/00369* (2013.01); *H03K 17/687* (2013.01)

(58) Field of Classification Search
CPC ...... H03K 17/687; H03K 17/16; H03K 17/14; H03K 17/56; H03K 3/013; H03K 3/353; H03K 5/088; H03K 5/125; H03K 7/08
USPC .......................... 327/108, 109, 110, 111, 112
See application file for complete search history.

(56) References Cited

U.S. PATENT DOCUMENTS

| 7,817,727 | B2 | 10/2010 | Kumar et al. |
| 8,633,733 | B2 | 1/2014 | Dettloff et al. |
| 2011/0193595 | A1* | 8/2011 | Fukuda .................. H03K 5/151 327/108 |
| 2013/0342241 | A1 | 12/2013 | Boecker et al. |
| 2013/0342242 | A1 | 12/2013 | Hsieh |

* cited by examiner

*Primary Examiner* — John Poos
(74) *Attorney, Agent, or Firm* — MHKKG (57) ABSTRACT

In one embodiment, a voltage mode driver circuit includes a first voltage adjusting circuit configured to provide an adjustable first pseudo-supply voltage to a first node based on a first supply voltage, including generating the first pseudo-supply voltage based on a first reference voltage and feedback from the first node. In this embodiment, the voltage mode driver circuit includes switching circuitry configured to selectively couple one of the first node or a second node to a first differential output terminal and a different one of the first node or the second node to a second differential output terminal based on a data signal. In this embodiment, the voltage mode driver circuit includes a current mode emphasis driver configured to selectively couple one of the first differential output terminal or the second differential output terminal to a first set of one or more current supplies and a different one of the first differential output terminal or second differential output terminal to a second set of one or more current supplies, based on one or more emphasis signals.

22 Claims, 6 Drawing Sheets

HYBRID DRIVER CIRCUIT

BACKGROUND

1. Technical Field

This disclosure relates to output drivers and more particularly to a hybrid output driver that includes both a voltage mode component and a current mode component.

2. Description of the Related Art

Designing output driver circuits becomes more difficult as these circuits are required to operate at higher speeds. For example, some driver circuits operate at 12.5 Gb/s or more. Examples of design parameters to be considered in designing these circuits include: operating speed, jitter, noise, layout area, circuit complexity, return loss, power consumption, and emphasis variation accuracy. Improved output driver circuit designs are desired to operate at a high frequency while minimizing jitter, noise, layout area, circuit complexity, return loss, and power consumption, but improving emphasis variation accuracy.

SUMMARY

Various embodiments of a hybrid output driver are disclosed. In one embodiment, a voltage mode driver circuit includes a first voltage adjusting circuit configured to provide an adjustable first pseudo-supply voltage to a first node based on a first supply voltage. In this embodiment, the voltage adjusting circuit includes first amplifier circuitry configured to generate the first pseudo-supply voltage based on a first reference voltage and feedback from the first node. In this embodiment, the voltage mode driver circuit includes switching circuitry configured to selectively couple one of the first node or a second node to a first differential output terminal and a different one of the first node or the second node to a second differential output terminal based on a data signal. In this embodiment, the voltage mode driver circuit includes a current mode emphasis driver configured to selectively couple one of the first differential output terminal or the second differential output terminal to a first set of one or more current supplies and a different one of the first differential output terminal or second differential output terminal to a second set of one or more current supplies, based on one or more emphasis signals. Thus, in some embodiments, a differential output swing at the differential output terminals is adjustable.

These embodiments will be more fully understood in view of the following description and drawings.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) for that unit/circuit/component.

DETAILED DESCRIPTION

Figure 1:
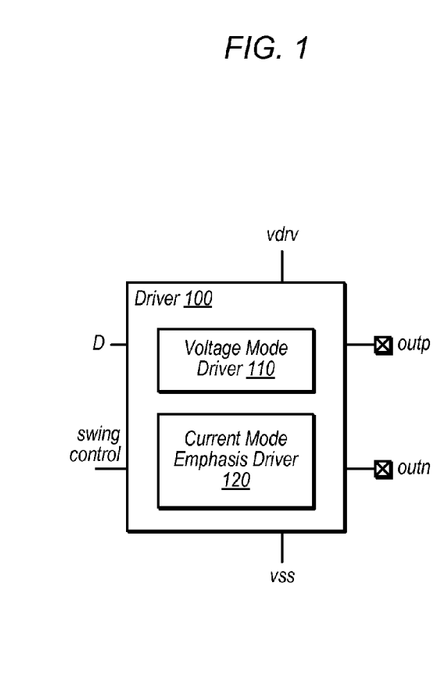
FIG. 1 is a block diagram of one embodiment of a driver circuit that includes a voltage mode driver and a current mode emphasis driver.

FIG. 1 shows a block diagram illustrating one embodiment of an output driver circuit 100. In the illustrated embodiment, driver 100 includes voltage mode driver 110 and current mode emphasis driver 120. Because driver 100 of FIG. 1 includes both a voltage mode driver component and a current mode emphasis driver component, this driver 100 may be referred to as a "hybrid" driver circuit. In the illustrated embodiment, driver 100 is configured to generate a programmable output voltage swing (based on the SWING CONTROL input signal, which may be a multi-bit signal) across output terminals OUTP and OUTN for an input data signal D. In various embodiments, current mode emphasis driver circuit 120 is configured to perform an equalization/emphasis function for driver 100.

In various embodiments, hybrid driver circuit 100 is a differential signal driver, configured to drive a differential output signal across output terminals OUTP and OUTN to an external load resistance $R_L$ (not shown). In the embodiments described herein, the load resistance $R_L$ may have a resistance of 100 Ohms. However, it is understood that the load resistance $R_L$ may vary and/or may have other resistances in other embodiments.

Figure 2:
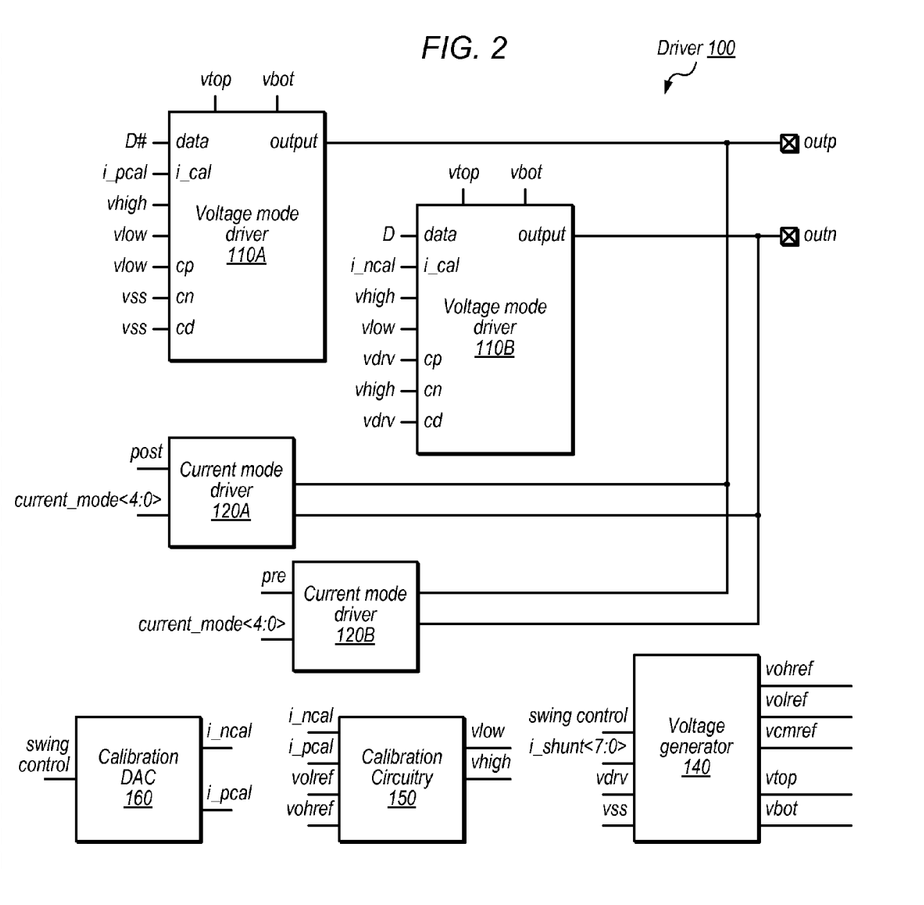
FIG. 2 is a more detailed block diagram of one embodiment of the driver circuit.

FIG. 2 shows a more detailed block diagram illustrating components of driver 100. In the illustrated embodiment, driver 100 includes voltage mode driver circuits 110A and 110B, current mode emphasis driver circuits 120A and 120B, voltage generator circuitry 140, calibration circuitry 150, and calibration DAC 160.

One exemplary embodiment of voltage generator 140 is described below with reference to FIG. 3. One exemplary embodiment of calibration circuitry 150 is described below with reference to FIG. 4. One exemplary embodiment of a voltage mode driver 110 is described below with reference to FIG. 5. One exemplary embodiment of a current mode emphasis driver 120 is described below with reference to FIG. 6.

Voltage mode drivers 110A and 110B, in the illustrated embodiment, are configured to selectively couple pseudo-supply voltages VTOP and VBOT to OUTP and OUTN respectively, based on input data signal D and inverted input data signal D#. In this embodiment, each voltage mode driver 110 is also configured to receive the following inputs: a calibration current I_CAL, calibration voltages VHIGH and VLOW, and three calibration replica voltages CP, CN, and CD.

Current mode emphasis drivers 120A and 120B, in the illustrated embodiment, are respectively configured to provide emphasis currents to output terminals OUTP and OUTN based on post and pre-cursor input data signals POST and PRE (time-shifted derivations of cursor data signal D which are delayed or advanced by one or more cursor data bits). In some embodiments, driver 100 implements finite impulse response (FIR) equalization. In other embodiments, any of various appropriate numbers of taps may be implemented for any of various types of filters. In these embodiments, only a single instance of a current mode emphasis driver 120 may be implemented (reducing the number of taps) or additional current mode emphasis drivers 120 may be configured in parallel with those shown to implement additional taps.

Voltage generator 140, in the illustrated embodiment, is configured to receive SWING CONTROL and I_SHUNT<7:0> and generate pseudo-supply voltages VTOP and VBOT. In this embodiment, voltage generator 140 is also configured to generate reference voltages VOHREF, VOLREF, and VCMREF. In one embodiment, VOHREF and VOLREF represented desired output voltages at output terminals OUTP and OUTN.

Calibration circuitry 150, in the illustrated embodiment, is configured to receive reference voltages VOHREF and VOLREF from voltage generate 140 and calibration currents I_NCAL and I_PCAL from calibration DAC 160. In this embodiment, calibration circuitry 150 is configured to generate calibration voltages VHIGH and VLOW.

Calibration DAC 160, in the illustrated embodiment, is a digital to analog converter configured to generate calibration currents I_NCAL and I_PCAL based on the SWING CONTROL signal. The SWING CONTROL signal, in some embodiments, is a multi-bit signal usable to control the voltage swing across OUTP and OUTN.

VDRV may be a supply voltage, e.g., at 1 volt in some embodiments. In some embodiments, VDRV is a derivation of a supply voltage VDD. VSS, in some embodiments, is coupled to ground.

Pseudo-Supply Voltage Generator

Figure 3:
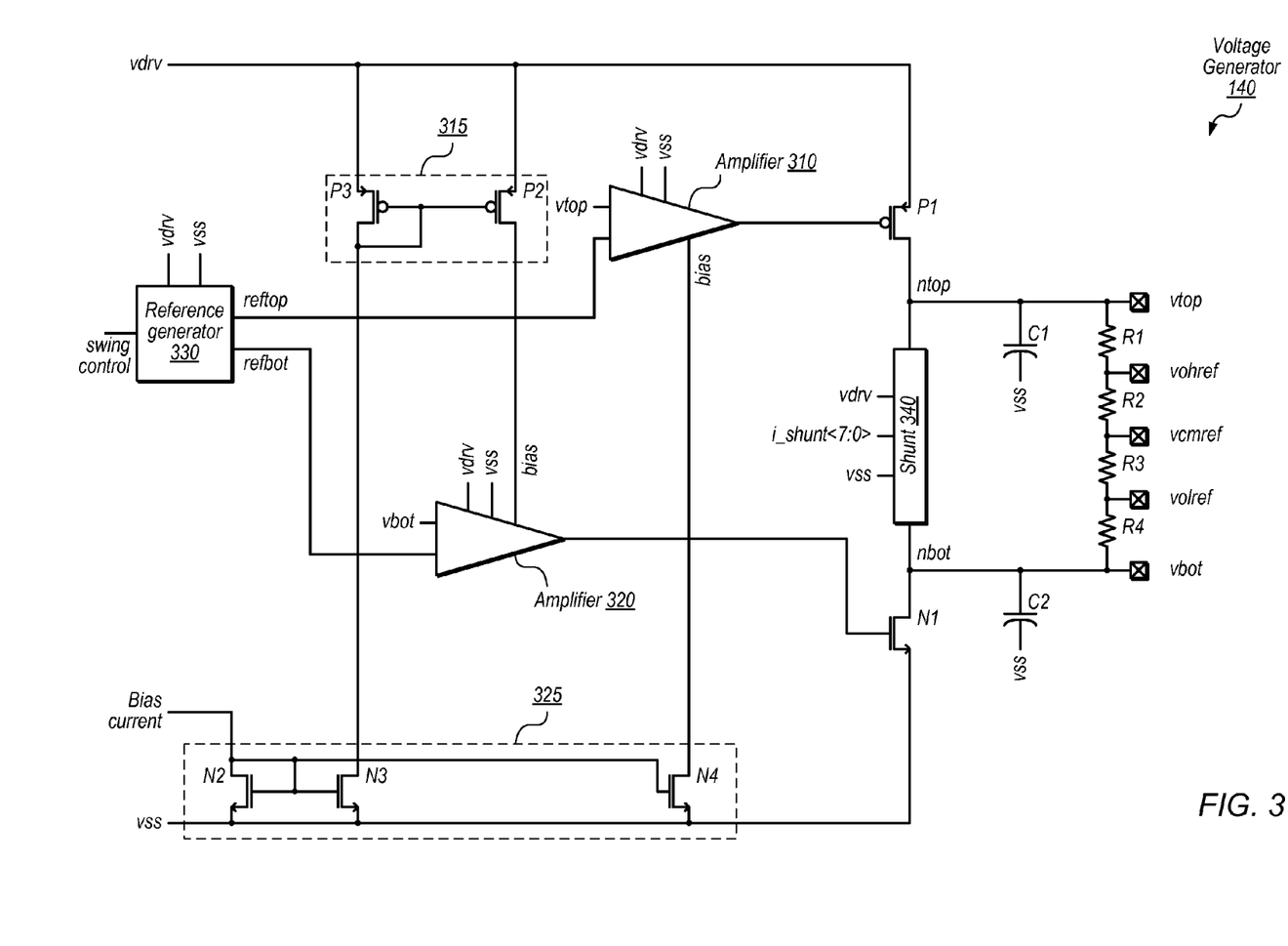
FIG. 3 is a circuit diagram illustrating one embodiment of a voltage generator circuit configured to provide one or more adjustable pseudo-supply voltages.

Turning now to FIG. 3, a circuit diagram illustrating one embodiment of a voltage generator circuit 140 is shown. In the illustrated embodiment, voltage generator 140 includes amplifiers 310 and 320, reference generator 330, shunt 340, p-channel transistors P1-P3, and n-channel transistors N1-N4.

In the illustrated embodiment, voltage generator 140 is configured to receive the following inputs: VDRV, VSS, a bias current, and a shunt control signal I_SHUNT<7:0>. In the illustrated embodiment, voltage generator 140 is configured to generate the following outputs: VTOP, VBOT VOHREF, VOLREF, VCMREF, and VOLREF.

Bias circuitry 315 and 325, in the illustrated embodiment, includes transistors P2, P3, N2, N3, and N4 and is configured to bias amplifiers 310 and 320 based on the bias current provided to N2.

Reference generator 330, in the illustrated embodiment, is configured to generate reference voltages REFTOP and REFBOT based on SWING CONTROL, VDRV and VSS. In one embodiment, reference generator 330 is a resistor divider circuit. In the illustrated embodiment, REFTOP and REFBOT are programmable using SWING CONTROL. In the illustrated embodiment, voltage generator 140 is configured to generate pseudo-supply voltages VTOP and VBOT at nodes NTOP and NBOT to match the voltages REFTOP and REFBOT respectively.

Amplifier 310, in the illustrated embodiment, is a unity gain feedback amplifier configured, in concert with transistor P1, to generate a pseudo-supply voltage VTOP at node NTOP to match REFTOP. Amplifier 310 may be implemented using any of various amplifier topologies, such as a differential pair amplifier, for example. Amplifier 320, in the illustrated embodiment, is similarly configured, in concert with transistor N1 to generate a pseudo-supply voltage VBOT at node NBOT to match REFBOT. Amplifier 310 and transistor P1 or amplifier 320 and transistor N1 may be referred to as means for generating an adjustable pseudo-supply voltage at a node based on a reference voltage and feedback from the node.

In various embodiments, using a feedback amplifier to generate pseudo-supply voltages may advantageously allow a wide range of programmable output voltage swings without requiring calibrated resistances. This may increase accuracy and reduce circuit area relative to using calibrated resistances to adjust a pseudo-supply voltage. Using a feedback amplifier may also be energy efficient in comparison with past approaches, allowing reduction in output voltage swing without excessive increases in power. Further, using a feedback amplifier may reduce variation in the output voltage swing based on changes in external load resistance. Finally, the configurations disclosed herein may reduce variation in the output voltage swing over process, voltage, and temperature variations in circuitry.

Capacitors C1 and C2, in the illustrated embodiment, are coupled between NTOP and VSS and NBOT and VSS respectively. In this embodiment, capacitors C1 and C2 are configured to compensate the feedback network in which VTOP and VBOT are fed back to amplifiers 310 and 320 respectively, in order to make VTOP and VBOT appear more like voltage supplies having low impedance and able to provide near instantaneous current.

Shunt 340, in the illustrated embodiment, is configured to bleed excess current from nodes NTOP and/or NBOT in order to maintain transistors P1 and N1 in a desired operating region. In one embodiment, shunt 340 includes a resistor ladder. In the illustrated embodiment, shift 340 is configured to bleed a programmable amount of current based on an eight-bit signal I_SHUNT<7:0>. In some embodiments, the greatest value of I_SHUNT corresponds to a greatest programmable swing across OUTP and OUTN.

VOHREF, VCMREF, and VOLREF, in the illustrated embodiment, are reference voltages generated based on VTOP and VBOT using resistors R1-R4. In one embodiment, resistors R1-R4 have the same nominal resistance. In some embodiments, VOHREF and VOLREF are desired voltages to be selectively provided to OUTP and OUTN based on the input data signal D.

In some embodiments, VBOT is coupled to ground rather than being a pseudo-supply voltage. However, generating both VBOT and VTOP may be advantageous, in some embodiments, to avoid a change in the common mode of the output.

Calibration Circuitry

Figure 4:
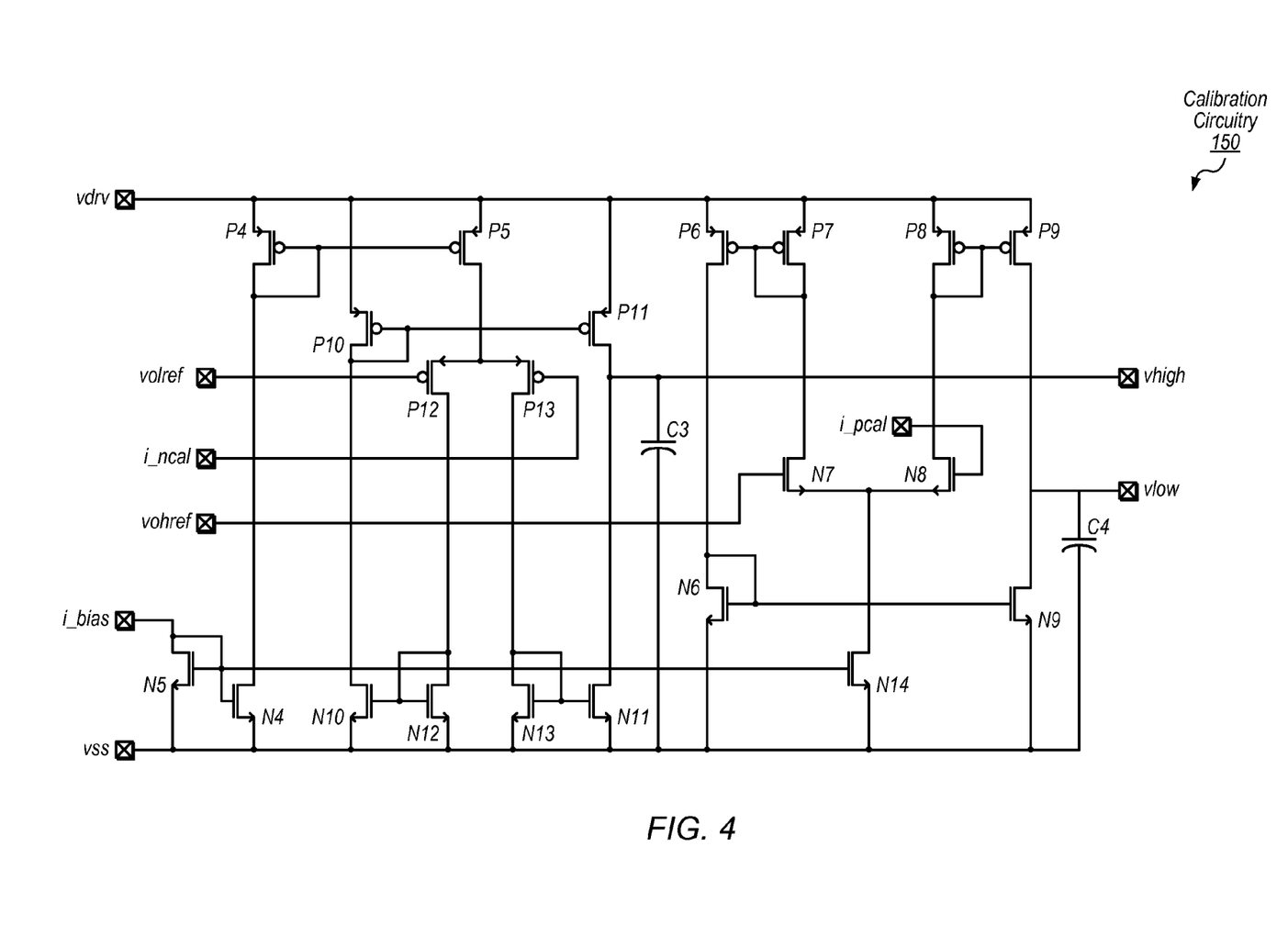
FIG. 4 is a circuit diagram illustrating one embodiment of a calibration circuit.

Turning now to FIG. 4, a circuit diagram illustrating one embodiment of calibration circuitry 150 is shown. In various embodiments, calibration circuitry 150, in conjunction with voltage mode drivers 110A and 110B, is configured to maintain a particular output impedance at OUTP and OUTN.

In various embodiments described herein, circuit elements are described as being the same or similar while particular voltages, impedances, and/or currents are described as being provided or maintained. However, it is well known that circuit characteristics vary across process, temperature, voltage, etc. Therefore, there may be variation among circuit elements that are nominally the same elements. Similarly, maintaining a particular operating parameter (e.g., a particular output impedance) may allow some variation about the nominal value to be maintained, for different operating points, voltage swings etc. In some embodiments, variations are reduced or compensated, e.g., by amplifiers 310 and 320 and/or various calibration circuitry described herein. However, it is understood that such variations may not be entirely eliminated.

In the illustrated embodiment, calibration circuitry 150 includes transistors P4-P13 and N4-N14 and compensating capacitors C3 and C4. In the illustrated embodiment, calibration circuitry 150 is configured to generate voltages VHIGH and VLOW based on VOLREF and VOHREF (provided by voltage generator 140) and calibration currents I_NCAL and I_PCAL.

Transistors P12 and P13, in the illustrated embodiment, are configured as a unity gain amplifier for I-NCAL and VOHREF as inputs, with transistors P4 and P5 configured as a current mirror and transistors N10/N12 and N11/N13 configured as current steering mirrors. Transistors N7 and N8, N6/N9, P6/P7 and P8/P9, and are similarly configured as a current mirror amplifier with I-PCAL and VOHREF as inputs. In various embodiments, VHIGH and VLOW are used to adjust the output impedance at OUTP and OUTN of driver 100 based on I_NCAL. This functionality is described in further detail below with reference to FIG. 5.

Voltage Mode Driver

Figure 5:
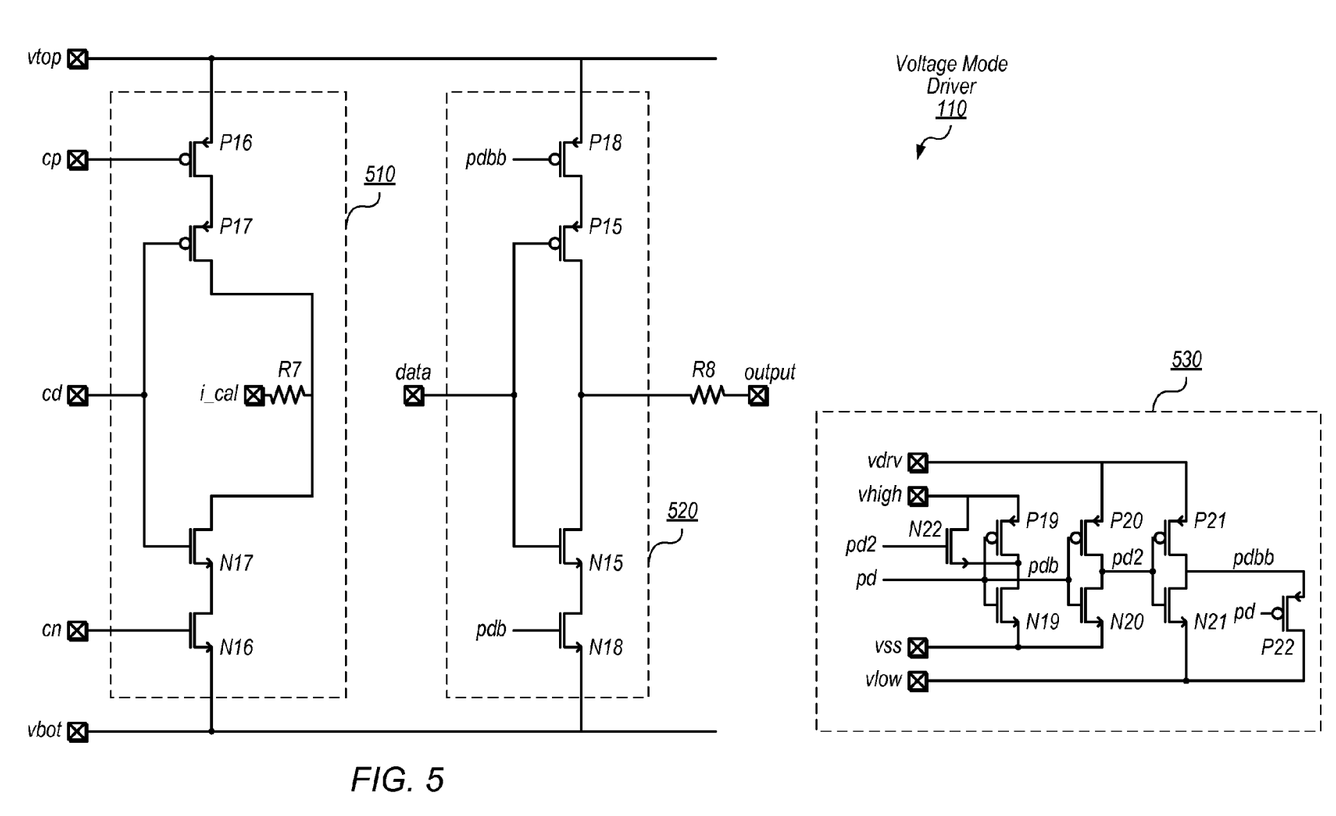
FIG. 5 is a circuit diagram illustrating one embodiment of a voltage mode driver circuit configured to select a pseudo-supply voltage from the voltage generator circuit to couple to an output terminal.

Turning now to FIG. 5, a circuit diagram illustrating one embodiment of a voltage mode driver 110 is shown. In the illustrated embodiment, voltage mode driver 110 includes transistors P15-P21 and N15-N22, resistors R7-R8, and routing circuitry 530. The circuitry in FIG. 5 includes a replica leg 510 and a switching leg 520.

In the illustrated embodiment, switching circuitry includes transistors P15 and N15 configured to couple the OUTPUT node to either NTOP or NBOT based on the signal at the DATA node (coupled to received either D or D#). Transistors P15 and N15 may be referred to as means for selectively coupling one of a first node or a second node to a first differential output terminal and a different one of the first node or the second node to a second differential output terminal. In the embodiment of FIG. 2, the two voltage mode drivers 110A and 110B are configured to perform this selection functionality for different output terminals OUTP and OUTN.

In the illustrated embodiment, power down circuitry includes transistors P18 and N18. When power down signal PD is asserted, P18 and N18 are turned off, reducing power consumption by voltage mode driver 110. When PD is not asserted, the power down circuitry is configured, in conjunction with calibration circuitry 150 and replica leg 510, to maintain a particular output impedance. In the illustrated embodiment, this is performed by generating PDB to match VHIGH and PDBB to match VLOW using routing circuitry 530 (note that VHIGH and VLOW are generated by calibration circuitry 150, described above with reference to FIG. 4). Various additional power down circuitry (not shown) may be included in order to reduce power consumption when driver 100 is not active.

Switching leg 520, in the illustrated embodiment, includes switching transistors P15 and N15 and power down transistors P18 and N18. Replica leg 510, in the illustrated embodiment, includes similar elements to switching leg 520 and is configured, in conjunction with calibration circuitry 150, to determine a voltage to apply to transistors P18 and N18 to maintain a particular output impedance at the OUTPUT terminal. In one embodiment, replica leg 510 includes circuit elements that are sized similarly to elements of switching leg 520. For example, N16 may be sized the match N18, etc. This embodiment may provide greater calibration accuracy but may consume more power. In other embodiments, replica leg 510 is sized to have a greater resistance than switching leg 520. For example, in these embodiments, elements in replica leg 510 may be 2, 3, 4, 8, 32, etc. times smaller than corresponding elements of switching leg 520. This may conserve power relative to similarly sized embodiments while still providing satisfactory calibration.

As shown in FIG. 2, two instances of voltage mode driver 110 (110A and 110B) are used for the two output terminals OUTP and OUTN. In the illustrated embodiment, voltage mode driver 110A is configured to calibrate the p-channel transistors while voltage mode driver 110B is configured to calibrate the n-channel transistors. Thus, VSS is provided to CD for voltage mode driver 110A, turning off the lower half of replica leg 510. Similarly VDRV is provided to CP for voltage mode driver 110B, turning off the upper half of replica leg 510. However, VLOW is provided to CP for voltage mode driver 110A, matching the voltage provided to P18 while VHIGH is provided to CN for voltage mode driver 110B, matching the voltage provided to N18.

In the illustrated embodiment, either I_NCAL or I_PCAL is coupled to I_CAL. These currents are programmable based on the SWING CONTROL as discussed above with reference to FIG. 2 and are used for calibration as described in further detail below.

Calibration Example

To facilitate explanation of the calibration and maintaining a particular output impedance, consider the following non-limiting example for voltage mode driver 110B, according to one embodiment. This example is described with reference to the circuitry of FIGS. 3-5. In this example, the desired impedance from OUTN/OUTPUT to VBOT is 50 ohms. Thus, the impedance of R8, N15, and N18 in FIG. 5 should sum to 50 ohms. In this example, replica leg 510 is sized to have 36 times the resistance of switching leg 520.

Referring to FIG. 3, If VBOT is programmed to 0.25V and VTOP is programmed to 0.75V (e.g., using SWING CONTROL), VOLREF will be 0.375V (in an embodiment in which R1-R4 are similarly sized). Referring to FIG. 5, the desired voltage at OUTPUT is 0.375V and thus the desired current through switching leg 520 is (0.375V−0.25V)/50 ohms=2.5 mA. Because the current through replica leg 510 is 1/36 the current through switching leg 520, the current through replica leg 510 is therefore 2.5 mA/36=69.8 uA. Referring to FIG. 4, the feedback amplifier that includes P12 and P13 is configured to generate VHIGH based on comparison of the output of replica leg 510 to the reference VOLREF at 0.375V. This results in the voltage at the output of replica leg 510 also being 0.375V, and the resistance of replica leg 510 being (0.375V−0.25V)/69.4 uA=1800 ohms. Because switching leg 520 has 36 times the resistance of replica leg 510 in this example, and the circuit elements are closely matched, the resistance through the main driver leg is 1800/36=50 ohms, as desired. As VBOT is increased, the resistance of transistor N18 for a given PDB voltage tends to increase, therefore the method described above adjusts PDB (VHIGH) to maintain a particular output impedance (50 ohms in this example) at the OUTPUT terminal for various different programmable voltage swings.

Similar techniques may be used for p-channel calibration using voltage mode driver 110A in order to generate VLOW for PDBB. This may result in a total output impedance of 100 ohms to match an expected load resistance of 100 ohms, in some embodiments. In other embodiments other types of calibration may be implemented. In embodiments that use replica circuitry to maintain a particular output impedance, various different configurations may be implemented; the illustrated embodiments are provided for exemplary purposes but are not intended to limit the scope of the present disclosure.

Transistors P18 and N18 may be referred to as calibration means. Calibration means may further include replica leg 510, calibration circuitry 150 and/or routing circuitry 530.

Current Mode Emphasis Driver

Figure 6:
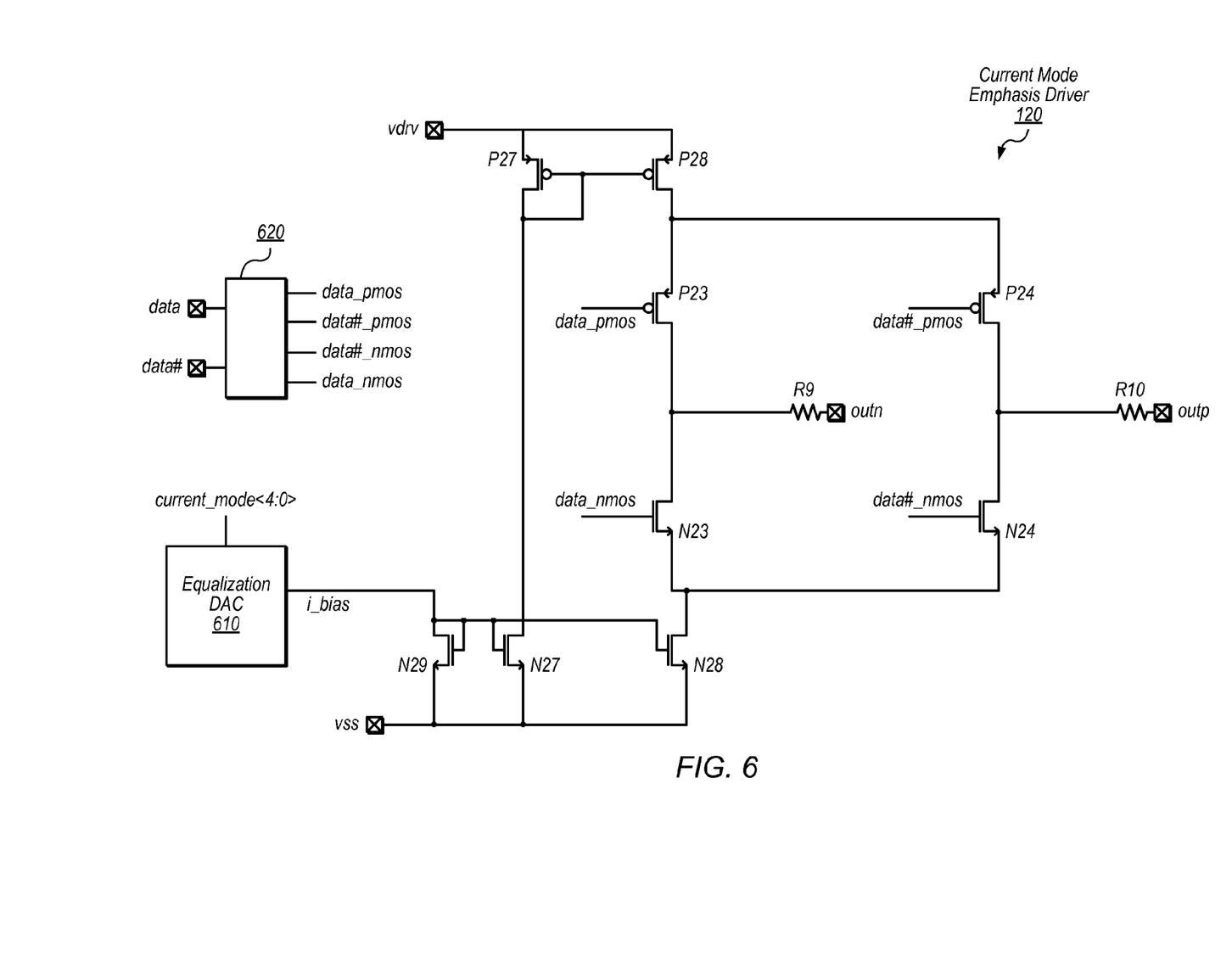
FIG. 6 is a circuit diagram illustrating one embodiment of a current mode emphasis driver circuit configured to provide an emphasis current to one or more output terminals.

Turning now to FIG. 6, a circuit diagram illustrating one embodiment of a current mode emphasis driver 120 is shown. In the illustrated embodiment, current mode emphasis driver 120 is configured to add or subtract current from the nominal output of driver 100, thereby providing equalization to the output current (and voltage). In the illustrated embodiment, current mode emphasis driver 120 is configured to receive inputs DATA, DATA# (the inverse of DATA), and CURRENT_MODE<4:0>. DATA may be provided as a pre or post-cursor derivation of input signal D (e.g., POST or PRE in the embodiment of FIG. 2). CURRENT_MODE<4:0> is usable to configure I_BIAS via equalization DAC 610, depending on a desired equalization level. In some embodiments, CURRENT_MODE<4:0> is set based on SWING CONTROL.

In the illustrated embodiment, element 620 is included for power down purposes. For example, when PD is asserted, element 620 may be configured to turn off transistors P23-24 and N23-24 rather than allowing half of those transistors to receive power. Otherwise, element 620 is configured to provide DATA_PMOS and DATA_NMOS to match DATA and DATA#_PMOS and DATA#_NMOS to match DATA#.

Transistors P28 and N28, in the illustrated embodiment, are current sources configured to provide an emphasis current to terminals OUTP or OUTN based on pre or post-cursor input signals provided to switching transistors P23/N23 and P24/N24. Transistors P23, N23, P24, and N24 may be referred to as means for selectively coupling one of a first differential output terminal or a second differential output terminal to one or more first current supplies and a different one of the first differential output terminal or second differential output terminal to one or more second current supplies. Transistors P27 and N27 are configured as current mirrors for the current sources in the illustrated embodiment.

In some embodiments, P23, N23, P24, and P24 may each comprise multiple devices in order to improve electrostatic discharge (ESD) performance. Each transistor may be coupled to a resistance (e.g., corresponding to R9 or R10) in series with the output pad, which may limit ESD current that could otherwise cause failure in embodiment in which a single device is used.

As noted above, multiple instances of current mode emphasis driver 120 may be coupled in parallel and configured to selectively provided emphasis currents from a set of current sources to output terminals OUTN and OUTP.

Exemplary Method

Figure 7:
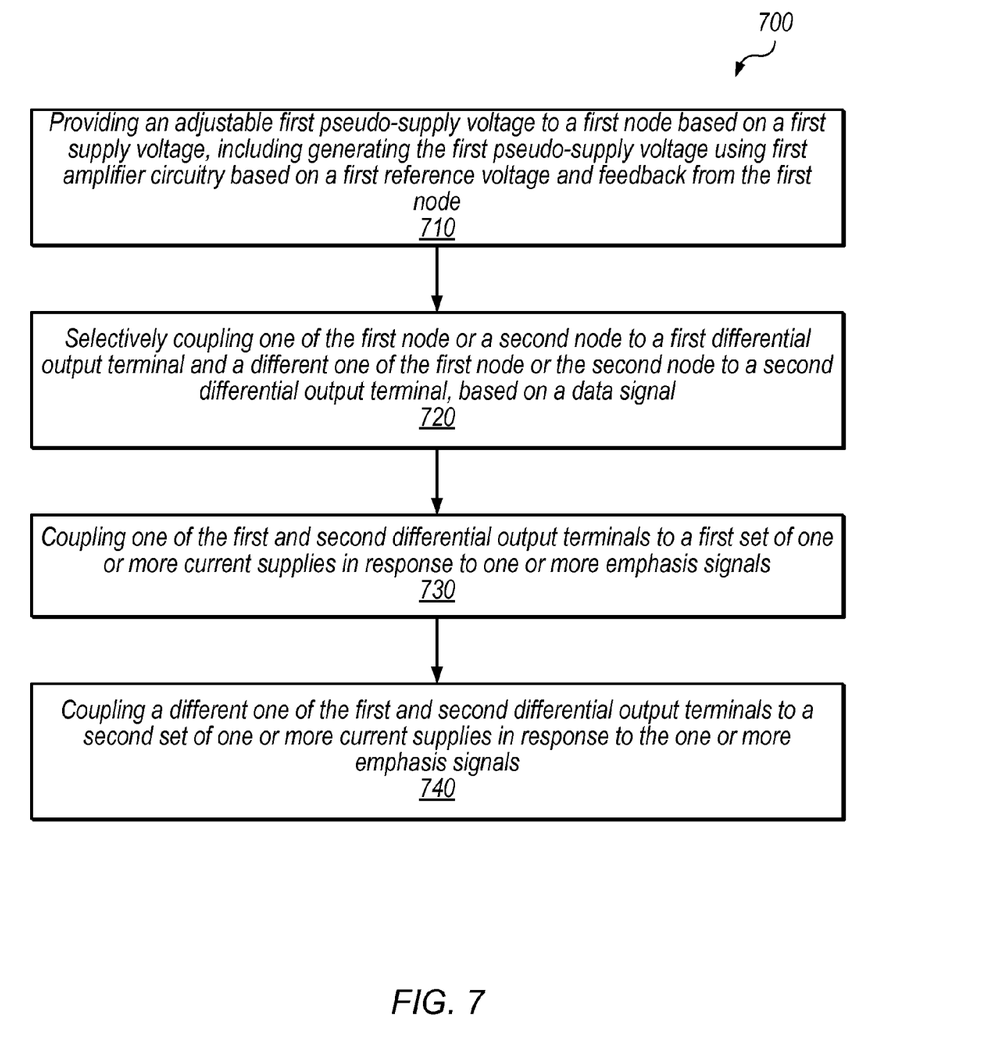
FIG. 7 is a flow diagram illustrating one embodiment of a method for operating a hybrid output driver.

Referring now to FIG. 7, a flow diagram illustrating one exemplary embodiment of a method 700 for operating a hybrid driver circuit is shown. The method shown in FIG. 7 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at block 710.

At block 710, an adjustable first pseudo-supply voltage is provided to a first node based on a first supply voltage. In this embodiment, providing the first pseudo-supply voltage includes generating the first pseudo-supply voltage using first amplifier circuitry based on a first reference voltage and feedback from the first node. For example, in one embodiment, voltage generator 140 is configured to provide VTOP to node NTOP based on VDRV and REFTOP, using VTOP as a feedback input to amplifier 310. Flow proceeds to block 720.

At block 720, one of the first node or a second node is selectively coupled to a first differential output terminal and a different one of the first node or the second node is selectively coupled to a second differential output terminal, based on a data signal. For example, in one embodiment, transistors P15 and N15 in voltage mode drivers 110A and 110B are configured to selectively couple nodes NBOT and NTOP to output terminals OUTP and OUTN based on data signal D. In these embodiments, an adjustable second pseudo-supply voltage is provided to the second node. In other embodiments, the second node is coupled to ground. Flow proceeds to block 730.

At block 730, one of the first and second differential output terminals is coupled to a first set of one or more current supplies in response to one or more emphasis signals. For example, in one embodiment, current mode emphasis drivers 120A and 120B are configured to selectively provide emphasis currents to OUTP based on PRE and POST. Flow proceeds to block 740.

At block 740, a different one of the first and second differential output terminals is coupled to a second set of one or more current supplies in response to the one or more emphasis signals. For example, in one embodiment, current mode emphasis drivers 120A and 120B are configured to selectively provide emphasis currents to OUTN based on PRE and POST. Flow ends at block 740.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A voltage mode driver circuit, comprising:
    a first voltage adjusting circuit configured to provide an adjustable first pseudo-supply voltage to a first node based on a first supply voltage, wherein the first voltage adjusting circuit includes first amplifier circuitry configured to generate the first pseudo-supply voltage based on a first reference voltage and feedback from the first node;
    switching circuitry configured to selectively couple one of the first node or a second node to a first differential output terminal and a different one of the first node or the second node to a second differential output terminal, based on a data signal;
    a current mode emphasis driver configured to selectively couple one of the first differential output terminal or the second differential output terminal to a first set of one or more current supplies and a different one of the first differential output terminal or second differential output terminal to a second set of one or more current supplies, based on one or more emphasis signals; and
    calibration circuitry configured to adjust impedance of a circuit element coupled to maintain a particular output impedance at the first differential output terminal, based on the first pseudo-supply voltage.

2. The voltage mode driver circuit of claim 1, wherein the second node is coupled to ground.

3. The voltage mode driver circuit of claim 1, further comprising:
    a second voltage adjusting circuit configured to provide an adjustable second pseudo-supply voltage to the second node based on a second supply voltage wherein the second voltage adjusting circuit includes second amplifier circuitry configured to generate the second pseudo-supply voltage based on a second reference voltage and feedback from the second node.

4. The voltage mode driver circuit of claim 1, wherein the first amplifier circuitry is configured as a voltage follower and configured to provide a unity gain.

5. The voltage mode driver circuit of claim 1, wherein the calibration circuitry includes:
    replica circuitry coupled in parallel with the switching circuitry;
    wherein the calibration circuitry is configured to adjust a voltage provided to the circuit element based on a current through the replica circuitry.

6. The voltage mode driver circuit of claim 1, wherein the one or more emphasis signals include multiple different time-shifted derivations of the data signal.

7. The voltage mode driver circuit of claim 1,
    wherein the current mode emphasis driver includes first and second current mode circuitry coupled in parallel;
    wherein the first current mode circuitry is configured to perform the selective coupling for a first one of the first set of current supplies and a first one of the second set of current supplies, based on a pre-cursor data signal; and
    wherein the second current mode circuitry is configured to perform the selective coupling for a second one of the first set of current supplies and a second one of the second set of current supplies, based on a post-cursor data signal.

8. The voltage mode driver circuit of claim 1, wherein the first set of current supplies and the second set of current supplies are adjustable to configure an equalization level of the current mode emphasis driver.

9. The voltage mode driver circuit of claim 1, further comprising:
    shunt circuitry coupled to the first node and configured to bleed an adjustable current from the first node to maintain the first amplifier circuitry in a desired operating range.

10. The voltage mode driver circuit of claim 1, further comprising:
    reference circuitry configured to generate the first reference voltage to set the adjustable first pseudo-supply voltage, wherein the reference circuitry includes a resistor divider.

11. A method, comprising:
    providing an adjustable first pseudo-supply voltage to a first node based on a first supply voltage, wherein the providing includes generating the first pseudo-supply voltage using first amplifier circuitry based on a first reference voltage and feedback from the first node;
    selectively coupling one of the first node or a second node to a first differential output terminal and a different one of the first node or the second node to a second differential output terminal, based on a data signal;
    coupling one of the first and second differential output terminals to a first set of one or more current supplies in response to one or more emphasis signals;
    coupling a different one of the first and second differential output terminals to a second set of one or more current supplies in response to the one or more emphasis signals; and
    deriving the one or more emphasis signals from the data signal.

12. The method of claim 11, further comprising:
    adjusting, using calibration circuitry, impedance of a circuit element coupled in series between the first differential output terminal and the first supply voltage, based on the first pseudo-supply voltage.

13. The method of claim 11, wherein the one or more emphasis signals include multiple time-shifted derivations of the data signal, including a pre-cursor data signal and a post-cursor data signal.

14. The method of claim 11, further comprising:
    adjusting current supplied by the first set of current supplies and the second set of current supplies to configure an equalization level.

15. A driver circuit, comprising:
    first means for generating an adjustable first pseudo-supply voltage at a first node based on a first reference voltage and feedback from the first node;
    second means for generating an adjustable second pseudo-supply voltage at a second node based on a second reference voltage and feedback from the second node;
    third means for selectively coupling one of the first node or the second node to a first differential output terminal and a different one of the first node or the second node to a second differential output terminal, based on a data signal;
    fourth means for selectively coupling one of the first differential output terminal or the second differential output terminal to one or more first current supplies and a different one of the first differential output terminal or second differential output terminal to one or more second current supplies, based on one or more emphasis signals; and,
    calibration means for maintaining a particular output impedance at the first and second differential output terminals for different values of the first and second pseudo-supply voltages respectively.

16. A voltage mode driver circuit, comprising:
a first voltage adjusting circuit configured to provide an adjustable first pseudo-supply voltage to a first node based on a first supply voltage, wherein the first voltage adjusting circuit includes first amplifier circuitry configured to generate the first pseudo-supply voltage based on a first reference voltage and feedback from the first node;
switching circuitry configured to selectively couple one of the first node or a second node to a first differential output terminal and a different one of the first node or the second node to a second differential output terminal, based on a data signal;
a current mode emphasis driver configured to selectively couple one of the first differential output terminal or the second differential output terminal to a first set of one or more current supplies and a different one of the first differential output terminal or second differential output terminal to a second set of one or more current supplies, based on one or more emphasis signals; and
wherein:
the one or more emphasis signals include multiple different time-shifted derivations of the data signal.
17. The voltage mode driver circuit of claim 16 further comprising:
wherein the first amplifier circuitry is configured as a voltage follower and configured to provide a unity gain.
18. The voltage mode driver circuit of claim 16 wherein: the second node is coupled to ground.
19. The voltage mode driver circuit of claim 1, wherein the calibration circuitry includes:
replica circuitry coupled in parallel with the switching circuitry;
wherein the calibration circuitry is configured to adjust a voltage provided to the circuit element based on a current through the replica circuitry.
20. The voltage mode driver circuit of claim 1, wherein the one or more emphasis signals include multiple different time-shifted derivations of the data signal.
21. The voltage mode driver circuit of claim 1, wherein the first set of current supplies and the second set of current supplies are adjustable to configure an equalization level of the current mode emphasis driver.
22. The voltage mode driver circuit of claim 1, further comprising:
shunt circuitry coupled to the first node and configured to bleed an adjustable current from the first node to maintain the first amplifier circuitry in a desired operating range.

* * * * *